United States Patent
Wysok et al.

(10) Patent No.: US 11,189,472 B2
(45) Date of Patent: Nov. 30, 2021

(54) CATHODE ASSEMBLY HAVING A DUAL POSITION MAGNETRON AND CENTRALLY FED COOLANT

(71) Applicant: APPLIED MATERIALS, INC., Santa Clara, CA (US)

(72) Inventors: Irena H. Wysok, San Jose, CA (US); Kirankumar Savandaiah, Bangalore (IN); Anthony Chih-Tung Chan, Sunnyvale, CA (US); Jiao Song, Singapore (SG); Prashant Prabhu, Karwar (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 660 days.

(21) Appl. No.: 15/651,791

(22) Filed: Jul. 17, 2017

(65) Prior Publication Data
US 2019/0019658 A1    Jan. 17, 2019

(51) Int. Cl.
*H01J 37/34* (2006.01)
*C23C 14/35* (2006.01)
*C23C 14/34* (2006.01)

(52) U.S. Cl.
CPC ........ *H01J 37/3455* (2013.01); *C23C 14/345* (2013.01); *C23C 14/3407* (2013.01); *C23C 14/35* (2013.01); *H01J 37/3405* (2013.01); *H01J 37/3426* (2013.01); *H01J 37/3497* (2013.01)

(58) Field of Classification Search
CPC .............. H01J 37/3455; H01J 37/3405; H01J 37/3426; H01J 37/3497
See application file for complete search history.

(56) References Cited

U.S. PATENT DOCUMENTS

| 4,855,022 | A | 8/1989 | Hurwitt |
| 6,153,068 | A | 11/2000 | Ohmi et al. |
| 6,641,701 | B1 * | 11/2003 | Tepman ............... H01J 37/3405 204/192.1 |
| 8,721,847 | B2 * | 5/2014 | Chang .................... C23C 14/54 204/192.13 |
| 2004/0045670 | A1 | 3/2004 | Tepman |
| 2004/0050690 | A1 | 3/2004 | Green et al. |
| 2005/0133361 | A1 * | 6/2005 | Ding ................... H01J 37/3455 204/192.12 |
| 2008/0060938 | A1 | 3/2008 | Miller et al. |
| 2009/0026073 | A1 * | 1/2009 | Harada .................. C23C 14/35 204/298.16 |

(Continued)

OTHER PUBLICATIONS

International Search Report and Written Opinion dated Nov. 27, 2018 received for PCT Application No. PCT/US2018/042280.

(Continued)

*Primary Examiner* — Jason Berman
(74) *Attorney, Agent, or Firm* — Moser Taboada

(57) ABSTRACT

Embodiments of a magnetron assembly and a processing system incorporating same are provided herein. In some embodiments, a magnetron assembly includes a body extending along a central axis of the magnetron assembly; a coolant feed structure extending through the body along the central axis to provide a coolant along the central axis to an area beneath the coolant feed structure; and a rotatable magnet assembly coupled to a bottom of the body and having a plurality of magnets.

20 Claims, 2 Drawing Sheets

(56) References Cited

U.S. PATENT DOCUMENTS

| | | |
|---|---|---|
| 2010/0243440 A1 | 9/2010 | Miller et al. |
| 2013/0056347 A1 | 3/2013 | West et al. |
| 2014/0061039 A1 | 3/2014 | Riker et al. |
| 2014/0246314 A1* | 9/2014 | Ritchie ............... H01J 37/3461 |
| | | 204/298.17 |

OTHER PUBLICATIONS

Supplementary European Search Report for EP 18834519, dated Mar. 8, 2021.

* cited by examiner

CATHODE ASSEMBLY HAVING A DUAL POSITION MAGNETRON AND CENTRALLY FED COOLANT

FIELD

Embodiments of the present disclosure generally relate to magnetrons for use in physical vapor deposition chambers for substrate processing.

BACKGROUND

Sputtering, alternatively called physical vapor deposition (PVD), has long been used in depositing metals and related materials in the fabrication of semiconductor integrated circuits. Use of PVD has been extended to depositing metal layers onto the sidewalls of high aspect-ratio holes such as vias or other vertical interconnect structures. Currently, advanced sputtering applications include depositing materials having high stress and high ion density into such vias.

For example, titanium, tantalum, and the like have been used in through silicon via (TSV) applications. The inventors have observed that in such applications where a high stress target material and, thus, high power, are utilized, the target begins to crack and bow due to high target temperatures and insufficient cooling. Although a coolant has been used to cool the backside of the target assembly, the magnetron oftentimes obstructs the coolant from reaching portions of the target above which the magnets are disposed at a given time.

The inventors have also observed that the deposition rate in such applications decreases over the target life, thus also decreasing throughput of the chamber. For example, in TSV applications using a titanium target, the deposition rate decreases from 18 angstroms per second (Ns) to 12 A/s over the target life. Conventional methods of addressing the deposition rate decrease include changing the power to compensate for deposition rate decrease. However, changing the power is laborious and requires constant monitoring of the deposition rate of the chamber.

Thus, the inventors have provided an improved cathode assembly having a magnetron that addresses the above-described issues.

SUMMARY

Embodiments of a magnetron assembly and a processing system incorporating same are provided herein. In some embodiments, a magnetron assembly includes a body extending along a central axis of the magnetron assembly; a coolant feed structure extending through the body along the central axis to provide a coolant along the central axis to an area beneath the coolant feed structure; and a rotatable magnet assembly coupled to a bottom of the body and having a plurality of magnets.

In some embodiments, a magnetron assembly includes a body extending along a central axis of the magnetron assembly; a coolant feed structure extending through the body along the central axis to provide a coolant along the central axis to an area beneath the coolant feed structure; and a rotatable magnet assembly coupled to a bottom of the body and having a plurality of magnets, wherein the rotatable magnet assembly is configured to move vertically.

In some embodiments, a magnetron assembly includes a body extending along a central axis of the magnetron assembly; a coolant feed structure extending through the body along the central axis to provide a coolant along the central axis to an area beneath the coolant feed structure; a rotatable magnet assembly coupled to a bottom of the body and having a plurality of magnets, wherein the rotatable magnet assembly is configured to rotate about the central axis at a first distance from the central axis and a second distance from the central axis, and wherein the rotatable magnet assembly is configured to move vertically; a first sensor configured to detect when the rotatable magnet assembly is rotating at the first distance; and a second sensor configured to detect when the rotatable magnet assembly is rotating at the second distance.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
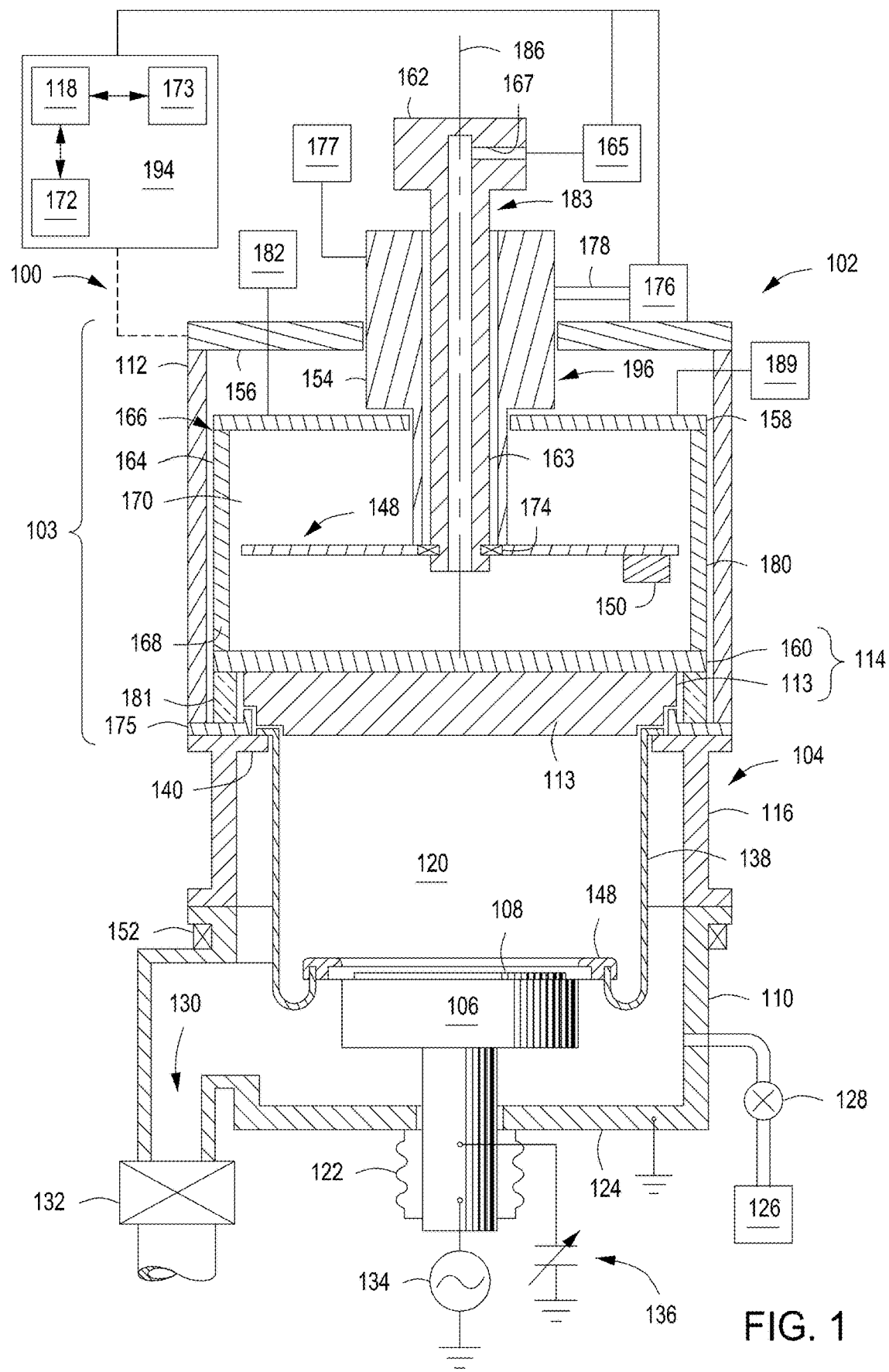
FIG. 1 depicts a schematic cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to a cathode assembly having a dual position magnetron that can advantageously improve cooling using centrally fed coolant and that can ensure a constant deposition rate by keeping the distance between the lowermost surface of the magnets of the magnetron and the lowermost surface of the sputtering target constant during deposition processes and physical vapor deposition (PVD) chambers incorporating such magnetrons. The inventive magnetron advantageously alleviates cracking and/or bowing of the target due to overheating and a decrease in the deposition rate over the life of the target.

Embodiments of the magnetron disclosed herein have two positions (outer radial position and inner radial position), thus enabling a change in the magnetic field at the sputtering target surface by the reconfiguration of the magnet poles in the different positions. As such, target utilization is further improved because the center and periphery of the target are both sputtered.

FIG. 1 depicts a simplified, cross-sectional view of a substrate processing system (e.g., physical vapor deposition (PVD) processing system 100) in accordance with some embodiments of the present disclosure. Examples of other PVD chambers suitable for modification in accordance with the teachings provided herein include the VENTURA® and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

For illustration, the PVD processing system 100 includes a chamber lid 102 removably disposed atop a process chamber 104. The chamber lid 102 may include a target assembly 114 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate 160).

The PVD processing system 100 further includes a magnetron assembly 196. The magnetron assembly 196 provides a rotating magnetic field proximate the target to assist in plasma processing within the process chamber 104. The magnetron assembly includes a rotatable magnet assembly 148 disposed within the cavity 170. The rotatable magnet assembly 148 rotates about a central axis 186 of the process chamber 104. The rotatable magnet assembly 148 provides two different closed magnetic field configurations that are selectable during use. In some embodiments, the configuration can be selected by rotating a section of the rotatable magnet assembly 148, as described below with respect to FIGS. 2A-B and 3A-B.

The magnetron assembly 196 includes a body 154, a first motor 176, a coupling assembly 178 (e.g., a gear assembly) coupled to the first motor 176 and the body 154, a coolant feed structure 183, and the rotatable magnet assembly 148. The rotatable magnet assembly 148 includes a plurality of magnets 150 and is configured to rotate the plurality of magnets 150 about the central axis 186 and a magnet axis 286 as well as move the magnet assembly 148 vertically within the cavity 170, as described below. In some embodiments, the magnetron assembly 196 further includes a second motor 177 coupled to the body 154 to control a vertical position of the body 154 (e.g., the body 154 may be a telescoping body). The first and second motors 176, 177 may be electric motors, pneumatic or hydraulic drives, or any other process-compatible mechanism that can provide the required movement. While one illustrative embodiment is described herein to illustrate how the rotatable magnet assembly 148 may be rotated, other configurations may also be used.

The inventors have discovered that the deposition rate of a target decreases over the life of the target because the distance from the plurality of magnets to the substrate-facing surface of the target changes as material is sputtered from the target. As such, in some embodiments, the inventive magnetron assembly 196 is also capable of vertical movement to control the distance from the plurality of magnets 150 to the substrate-facing surface of the target assembly 114, for example, to ensure that the distance remains substantially constant.

In use, the magnetron assembly 196 rotates and, in some embodiments, vertically moves the rotatable magnet assembly 148 within the cavity 170. For example, in some embodiments, the first motor 176 and coupling assembly 178 may be provided to rotate the rotatable magnet assembly 148 while the second motor 177 moves the rotatable magnet assembly 148 in a vertical direction. The body 154 is fixedly coupled to the rotatable magnet assembly 148. The rotatable magnet assembly 148 is rotatably coupled to the coolant feed structure 183 to allow the rotatable magnet assembly 148 to rotate while the coolant feed structure remains stationary. In some embodiments, the rotatable magnet assembly 148 is coupled to a bottom portion of the coolant feed structure 183 via a bearing 174.

In some embodiments, the coupling assembly 178 may be a belt that includes ridges which mate with grooves disposed in the first motor 176 and the body 154 to transfer the rotational motion provided by the first motor 176 to the rotatable magnet assembly 148. A similar motor (not shown) may be coupled to the plurality of magnets 150 to rotate the plurality of magnets 150 about the magnet axis 286, as discussed below. In some embodiments, the coupling assembly 178 may alternatively be coupled to the rotatable magnet assembly 148 through the use of pulleys, gears, or other suitable means of transferring the rotational motion provided by the first motor 176.

The inventors have further discovered that conventionally supplied coolant feed structures supply coolant from a side of the cavity. However, because coolant flowing to the portion of the target assembly immediately beneath the plurality of magnets is obstructed by the magnets, the portion of the target assembly immediately beneath the plurality of magnets does not receive a sufficient amount of coolant. As a result, as the rotatable magnet assembly rotates, the area within which the plurality of magnets moves over becomes excessively hot, sometimes reaching up to 400° C. A resulting temperature gradient is formed between portions of the target that are sufficiently cooled and portions that are not sufficiently cooled. The temperature gradient leads to target cracking and/or bowing.

To keep the target assembly 114 at a temperature less than about 200° C., the inventors have developed the coolant feed structure 183, which supplies coolant to a center of the target assembly 114 (i.e., along the central axis 186. The coolant feed structure 183 extends through the body 154 along the central axis 186. The coolant feed structure 183 and includes a central channel 161 extending along the central axis 186 from a manifold portion 162 through a body portion 163. A coolant supply 165 is fluidly coupled to an inlet 167 of the manifold portion 162 to supply a coolant through the coolant feed structure 183 and into the cavity 170.

Figure 2:
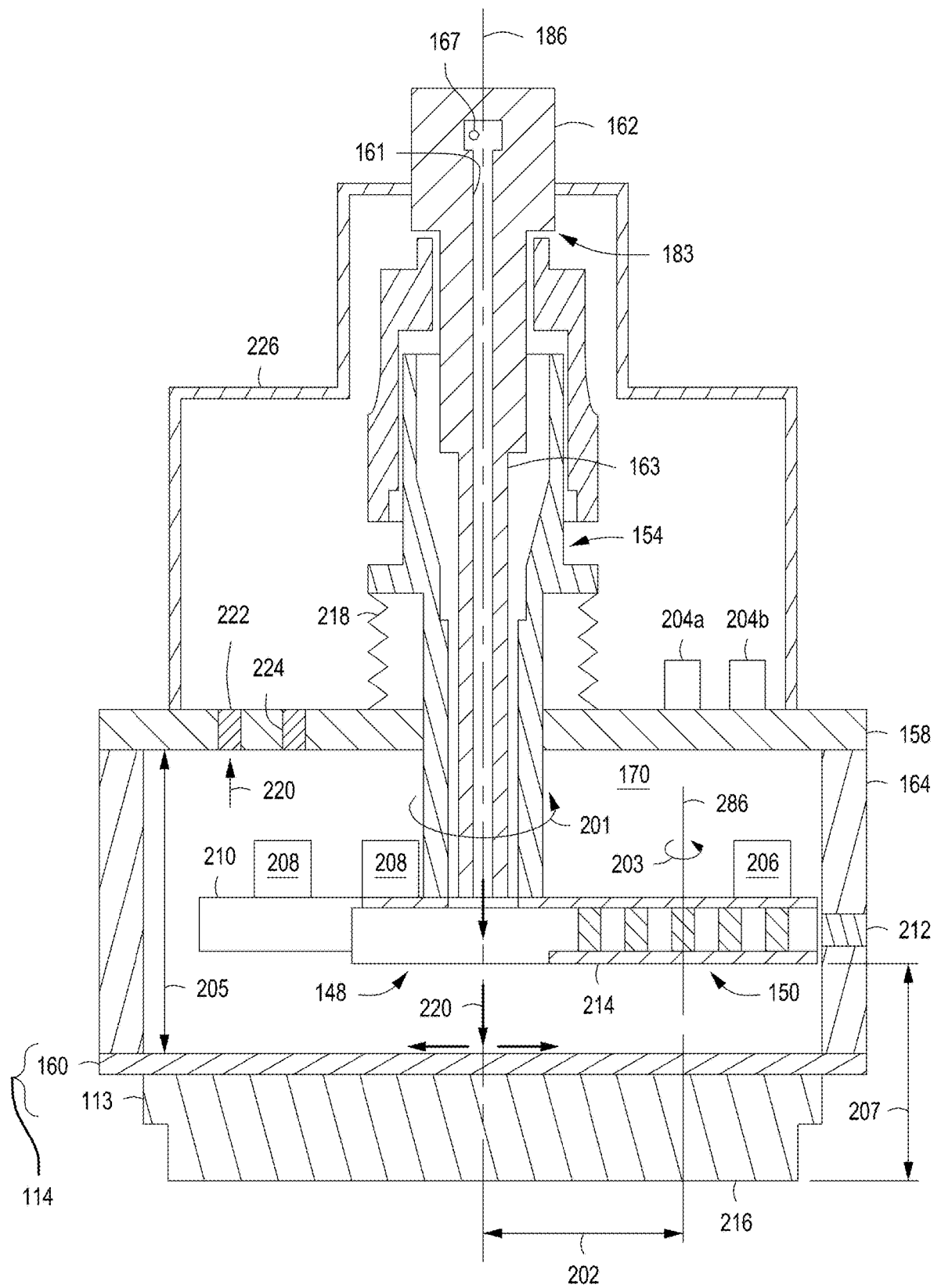
FIG. 2 depicts a schematic cross-sectional view of a magnetron assembly in accordance with some embodiments of the present disclosure.

FIG. 2 depicts a schematic cross-sectional view of the magnetron assembly 196 in accordance with some embodiments of the present disclosure. As discussed above, the rotatable magnet assembly 148 can rotate the plurality of magnets 150 (as indicated by arrow 201) about the central axis 186 at a first distance (inner radial position) about the central axis 186 and at a second distance (outer radial position as depicted in FIG. 2), which is greater than the first distance, from the central axis 186. The plurality of magnets 150 are also configured to rotate (as indicated by arrow 203) about the magnet axis 286 passing through a center of the plurality of magnets 150. At the outer radial position, the magnet axis 286 is spaced apart from the central axis 186 by a first distance 202. At the inner radial position, the magnet axis 286 is spaced apart from the central axis 186 by a second distance less than the first distance 202. In some embodiments, a cover 226 may optionally be disposed atop the source distribution plate 158 around the portion of the magnetron assembly 196 that extends above the source distribution plate 158 exposing only the manifold portion 162.

In some embodiments, the magnetron assembly 196 may include two or more sensors (two sensors 204a, 204b shown in FIG. 2) configured to determine whether the plurality of magnets 150 are rotating in the outer radial position or the inner radial position. The two sensors 204a, 204b are disposed atop the source distribution plate 158 are different radial positions. The rotatable magnet assembly 148 includes an indicating element 206 disposed atop the plurality of magnets 150. The two sensors 204a, 204b are arranged in a manner so that when a second sensor 204b detects the indicating element 206, the plurality of magnets 150 are being rotated about the central axis 186 at the outer radial position (as depicted in FIG. 2) and when a first sensor 204a detects the indicating element 206, the plurality of magnets 150 are being rotated about the central axis 186 at the inner radial position. In some embodiments, a third sensor 212 may be disposed through the conductive support ring 164 to detect the movement of the plurality of magnets 150 and to detect the vertical position of the rotatable magnet assembly 148.

The first motor 176 is configured to rotate the rotatable magnet assembly 148 at a first predetermined speed so that at a first speed, the plurality of magnets 150 rotate at the inner radial position and at a second predetermined speed, the plurality of magnets 150 rotate at the outer radial position. To ensure the correct radial position of the plurality of magnets 150, one or more stoppers 208 and a counterweight 210 may be utilized.

As noted above, the magnetron assembly 196 is configured to move the rotatable magnet assembly 148 in a vertical direction as indicated by arrow 205 to ensure that a vertical distance 207 between a first lowermost surface 214 of the plurality of magnets 150 and a second lowermost surface 216 of the target assembly 114 remains substantially constant through the life of the target. As a result, a decrease in deposition rate of the target is advantageously substantially reduced or eliminated. The body 154 is coupled directly to the rotatable magnet assembly 148 to transmit the movement of the second motor 177 to and vertically move the rotatable magnet assembly 148. To ensure that the cavity 170 is sealed off from the surrounding environment, the body 154 may be coupled to the source distribution plate 158 via bellows 218.

As noted above and illustrated in FIG. 2, the coolant feed structure 183 extends through the body 154 along the central axis 186 to supply a coolant (as shown by flow lines 220) to the cavity at a center of the target assembly 114. As a result, a more uniform flow of coolant is advantageously achieved, thus substantially reducing or eliminating the temperature gradient across the target assembly 114. Cracking and bowing of a source material 113 of the target assembly 115 is, therefore, also substantially reduced or eliminated. After entering the cavity 170 through the coolant feed structure 183, the coolant subsequently flows out of the cavity 170 through an opening 224 formed in an outlet 222 disposed in the source distribution plate 158. A return line (not shown) is coupled to the outlet 222 to receive the coolant after the coolant has flowed through the cavity 170.

Returning to FIG. 1, the substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a central region 120 of the process chamber 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In some embodiments, RF power may be supplied in a range from about 2 kW to about 20 kW. In some embodiments, DC power may be supplied in range from about 2 kW to about 40 kW. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in a lower, loading position but rests on the outer periphery of the substrate support 106 when in an upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a desired cross-section. The seal ring 181 may include two opposing planar and generally parallel surfaces to facilitate interfacing with the target assembly 114, such as the backing plate 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 includes the source material 113 to be deposited on a substrate, such as the substrate 108 during sputtering, such as a metal, metal oxide, metal alloy, or the like. In some embodiments, the source material 113 may be titanium, tantalum, tungsten, or the like. In embodiments consistent with the present disclosure, the target assembly 114 includes a backing plate 160 to support the source material 113. The source material 113 may be disposed on a substrate support facing side of the backing plate assembly 160 as illustrated in FIG. 1. The backing plate 160 may comprise a conductive material, such as copper-zinc, copper-chrome, or the same material as the target, such that RF and DC power can be coupled to the source material 113 via the backing plate 160. Alternatively, the backing plate 160 may be non-conductive and may include conductive elements (not shown) such as electrical feedthroughs or the like. The backing plate 160 may be disc shaped, rectangular, square, or any other shape that may be accommodated by the PVD processing system 100. The backing plate 160 is configured to support the source material 113 such that a front surface of the source material opposes the substrate 108 when present. The source material 113 may be coupled to the backing plate 160 in any suitable manner. For example, in some embodiments, the source material 113 may be diffusion bonded to the backing plate 160.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate 160 proximate the peripheral edge of the backing plate 160.

An insulative gap 180 is provided between the grounding plate 156 and the outer surfaces of the source distribution plate 158, the conductive support ring 164, and the target assembly 114. The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 189 to provide additional energy to the target assembly 114 during processing. In some embodiments, the second energy source 189 may be a DC power source to provide DC energy, for example, to enhance a sputtering rate of the target material (and hence, a deposition rate on the substrate). In some embodiments, the second energy source 189 may be a second RF power source, similar to the RF power source 182, to provide RF energy, for example, at a second frequency different than a first frequency of RF energy provided by the RF power source 182. In embodiments where the second energy source 189 is a DC power source, the second energy source may be coupled target assembly 114 in any location suitable to electrically couple the DC energy to the target assembly 114, such as the source distribution plate 158 or some other conductive member.

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods may be stored in the memory 172 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to embodiments of the present disclosure, other and further embodiments of the disclosure may be devised without departing from the basic scope thereof.

The invention claimed is:

1. A magnetron assembly, comprising:
    a body extending along and rotatable about a central axis of the magnetron assembly;
    a coolant feed structure that is fixed and that extends through the body along the central axis to provide a coolant along the central axis to an area beneath the coolant feed structure; and
    a rotatable magnet assembly coupled to a bottom of the body such that rotation of the body rotates the rotatable magnet assembly about the central axis and the coolant feed structure, the rotatable magnet assembly having a plurality of magnets, wherein the plurality of magnets are further configured to rotate about a magnet axis passing centrally through the plurality of magnets.

2. The magnetron assembly of claim 1, wherein the rotatable magnet assembly is rotationally coupled to a bottom portion of the coolant feed structure via a bearing so that the rotatable magnet assembly may rotate while the coolant feed structure remains stationary.

3. The magnetron assembly of claim 2, further comprising:
    a first sensor configured to detect when the rotatable magnet assembly is rotating at a first distance; and
    a second sensor configured to detect when the rotatable magnet assembly is rotating at a second distance.

4. The magnetron assembly of claim 3, wherein the rotatable magnet assembly further comprises:
    an indicating element detectable by the first and second sensors to determine whether the plurality of magnets are being rotated at the first distance or the second distance.

5. The magnetron assembly of claim 1, wherein the plurality of magnets are disposed between an upper plate and a lower plate of the rotatable magnet assembly, wherein the upper plate includes an opening aligned with the central axis and wherein the lower plate is disposed radially outward of the central axis.

6. The magnetron assembly of claim 5, further comprising:
    a third sensor configured to determine if the rotatable magnet assembly is rotating and to determine a vertical position of the rotatable magnet assembly.

7. The magnetron assembly of claim 1, wherein the rotatable magnet assembly includes a stopper on a side opposite the plurality of magnets about the central axis.

8. A substrate processing system, comprising:
    a chamber;
    a lid removably disposed atop the chamber;
    a target assembly coupled to the lid, the target assembly including a target material to be sputtered from the target assembly and deposited on a substrate;
    a substrate support disposed within the chamber to support a substrate during processing;
    a coolant supply; and
    the magnetron assembly of claim 1 disposed adjacent the target assembly on a side opposite the substrate support, wherein the coolant feed structure is configured to provide the coolant from the coolant supply along the central axis to a cavity above the target assembly to cool the target assembly, and wherein the rotatable magnet assembly is disposed in the cavity.

9. The substrate processing system of claim 8, further comprising:
    a first motor coupled to the body via a coupling assembly to rotate the body and the rotatable magnet assembly; and
    a second motor coupled to the body to vertically move the rotatable magnet assembly within the cavity.

10. The substrate processing system of claim 9, wherein the second motor is configured to vertically move the rotatable magnet assembly so that a vertical distance between a first lowermost surface of the plurality of magnets and a second lowermost surface of the target assembly remains substantially constant.

11. The substrate processing system of claim 8, wherein the rotatable magnet assembly is coupled to a bottom portion of the coolant feed structure via a bearing that is disposed in the cavity.

12. The substrate processing system of claim 8, further comprising:
    a DC power source coupled to the target assembly; and
    an RF power source coupled to the target assembly.

13. The substrate processing system of claim 8, wherein the target material comprises one of titanium, tantalum, or tungsten.

14. A magnetron assembly, comprising:
    a body extending along and rotatable about a central axis of the magnetron assembly;
    a coolant feed structure that is fixed and that extends through the body along the central axis to provide a coolant along the central axis to an area beneath the coolant feed structure; and
    a rotatable magnet assembly coupled to a bottom of the body such that rotation of the body rotates the rotatable magnet assembly about the central axis and about the fixed coolant feed structure, the rotatable magnet assembly having a plurality of magnets, wherein the rotatable magnet assembly is configured to move vertically, and wherein all magnets of the rotatable magnet assembly are configured to further rotate about a common magnet axis disposed at a center of the plurality of magnets, and wherein the rotatable magnet assembly is rotatably coupled to the coolant feed structure.

15. The magnetron assembly of claim 14, wherein the rotatable magnet assembly is configured to rotate about the central axis at a first distance from the central axis and a second distance from the central axis.

16. The magnetron assembly of claim 15, further comprising:
a third sensor configured to determine if the rotatable magnet assembly is rotating and to determine a vertical position of the rotatable magnet assembly.

17. The magnetron assembly of claim 15, further comprising:
a first sensor configured to detect when the rotatable magnet assembly is rotating at the first distance; and
a second sensor configured to detect when the rotatable magnet assembly is rotating at the second distance.

18. The magnetron assembly of claim 17, wherein the rotatable magnet assembly further comprises:
an indicating element detectable by the first and second sensors to determine whether the plurality of magnets are being rotated at the first distance or the second distance.

19. A magnetron assembly, comprising:
a body extending along a central axis of the magnetron assembly;
a coolant feed structure extending through the body along the central axis to provide a coolant along the central axis to an area beneath the coolant feed structure;
a rotatable magnet assembly fixedly coupled to a bottom of the body and rotatably coupled to the coolant feed structure, the rotatable magnet assembly having a plurality of magnets, wherein the rotatable magnet assembly is configured to rotate about the central axis at a first distance from the central axis and a second distance from the central axis, wherein the rotatable magnet assembly includes a stopper on a side opposite the plurality of magnets about the central axis and wherein the rotatable magnet assembly is configured to move vertically;
a first sensor configured to detect when the rotatable magnet assembly is rotating at the first distance; and
a second sensor configured to detect when the rotatable magnet assembly is rotating at the second distance.

20. The magnetron assembly of claim 19, wherein the rotatable magnet assembly further comprises:
an indicating element detectable by the first and second sensors to determine whether the plurality of magnets are being rotated at the first distance or the second distance.

* * * * *